United States Patent
Yokoyama

(10) Patent No.: US 9,865,796 B2
(45) Date of Patent: Jan. 9, 2018

(54) METHOD FOR DRIVING PIEZOELECTRIC ELEMENT, PIEZOELECTRIC ELEMENT, AND PIEZOELECTRIC ELEMENT APPLIED DEVICE

(71) Applicant: SEIKO EPSON CORPORATION, Tokyo (JP)

(72) Inventor: Naoto Yokoyama, Matsumoto (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 14/971,548

(22) Filed: Dec. 16, 2015

(65) Prior Publication Data
US 2016/0225976 A1 Aug. 4, 2016

(30) Foreign Application Priority Data
Jan. 30, 2015 (JP) .................. 2015-017778

(51) Int. Cl.
*H01L 41/04* (2006.01)
*H01L 41/187* (2006.01)
*B41J 2/045* (2006.01)

(52) U.S. Cl.
CPC ........ *H01L 41/042* (2013.01); *B41J 2/04541* (2013.01); *B41J 2/04573* (2013.01); *B41J 2/04581* (2013.01); *B41J 2/04588* (2013.01); *H01L 41/1873* (2013.01); *H01L 41/1875* (2013.01); *H01L 41/1878* (2013.01)

(58) Field of Classification Search
CPC ............ H01L 41/1873; H01L 41/1875; H01L 41/1878; H01L 41/042; H02N 2/0075; H02N 2/06; H02N 2/062; H02N 2/065; H02N 2/14; H02N 2/142; H02N 2/145
USPC .............. 310/317, 323.01–323.21, 328
See application file for complete search history.

(56) References Cited

U.S. PATENT DOCUMENTS

| | | | |
|---|---|---|---|
| 2002/0163282 A1* | 11/2002 | Heinz ................. | F02M 47/027 310/328 |
| 2004/0178701 A1* | 9/2004 | Sato ..................... | H01L 41/0838 310/328 |
| 2006/0055745 A1 | 3/2006 | Yagi | |
| 2006/0082253 A1* | 4/2006 | Hara ..................... | H02N 2/062 310/317 |

FOREIGN PATENT DOCUMENTS

| | | |
|---|---|---|
| JP | 2006-086223 A | 3/2006 |
| JP | 2012-156160 A | 8/2012 |

* cited by examiner

*Primary Examiner* — Derek Rosenau
(74) *Attorney, Agent, or Firm* — Workman Nydegger

(57) ABSTRACT

A method for driving a piezoelectric element including a first electrode, a piezoelectric layer formed on the first electrode and containing a composite oxide of an $ABO_3$ type perovskite structure, and a second electrode formed on the piezoelectric layer, and the method includes driving the piezoelectric element by applying a signal having a predetermined driving waveform by a predetermined number of times, and driving the piezoelectric element by applying a signal having the predetermined driving waveform in reverse polarity.

9 Claims, 12 Drawing Sheets

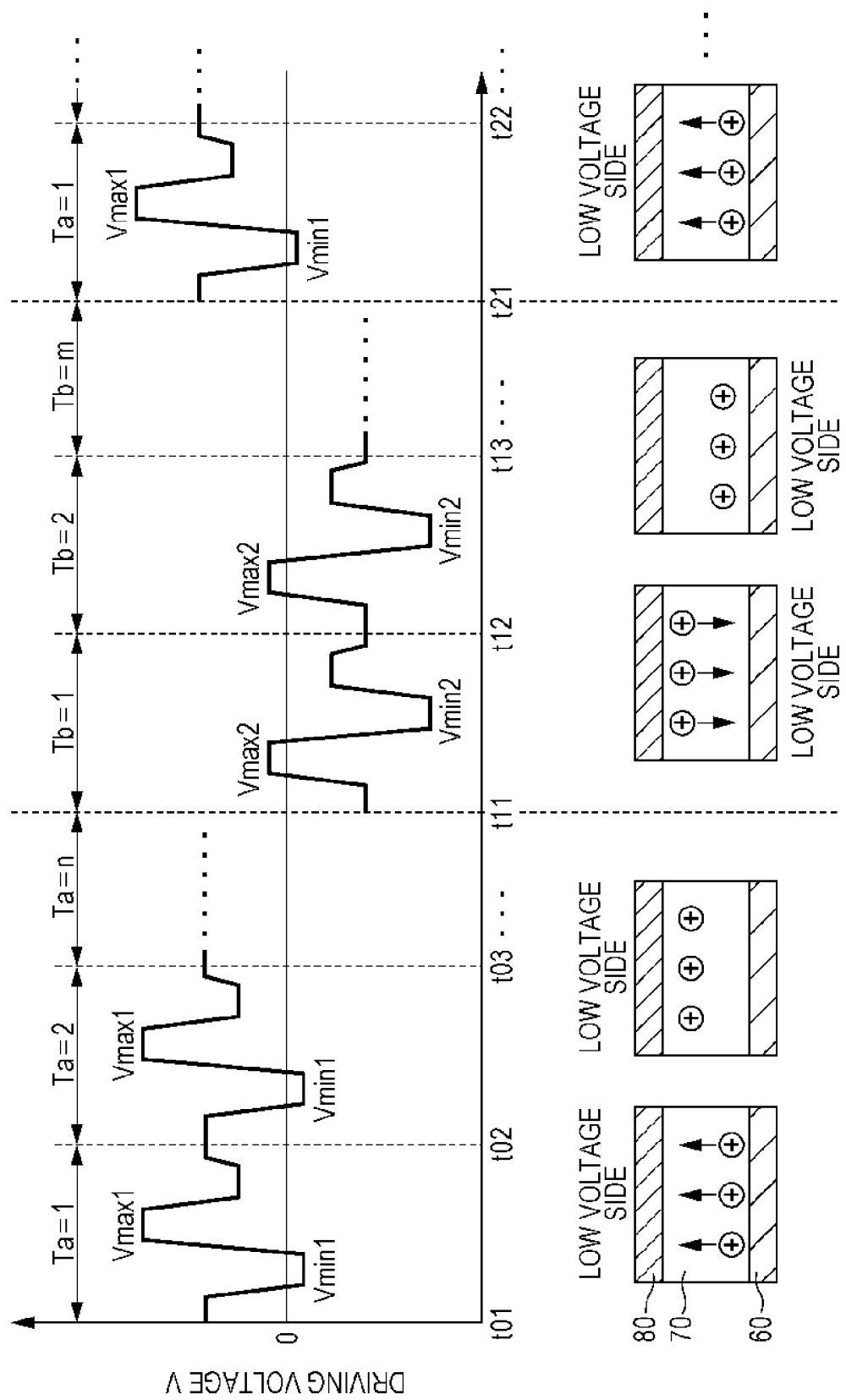

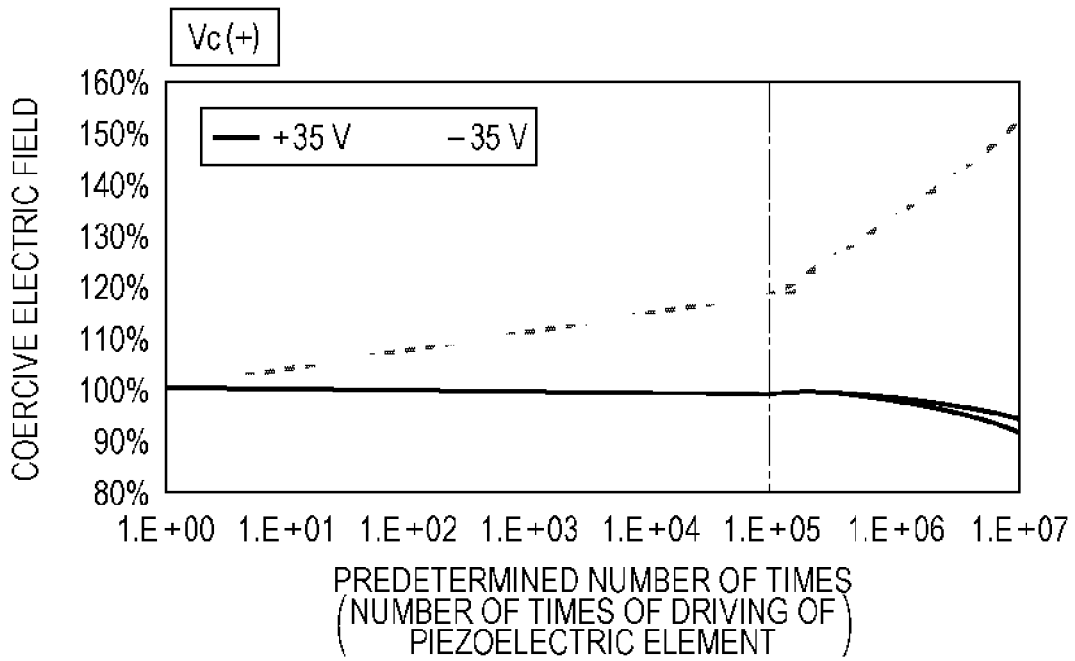
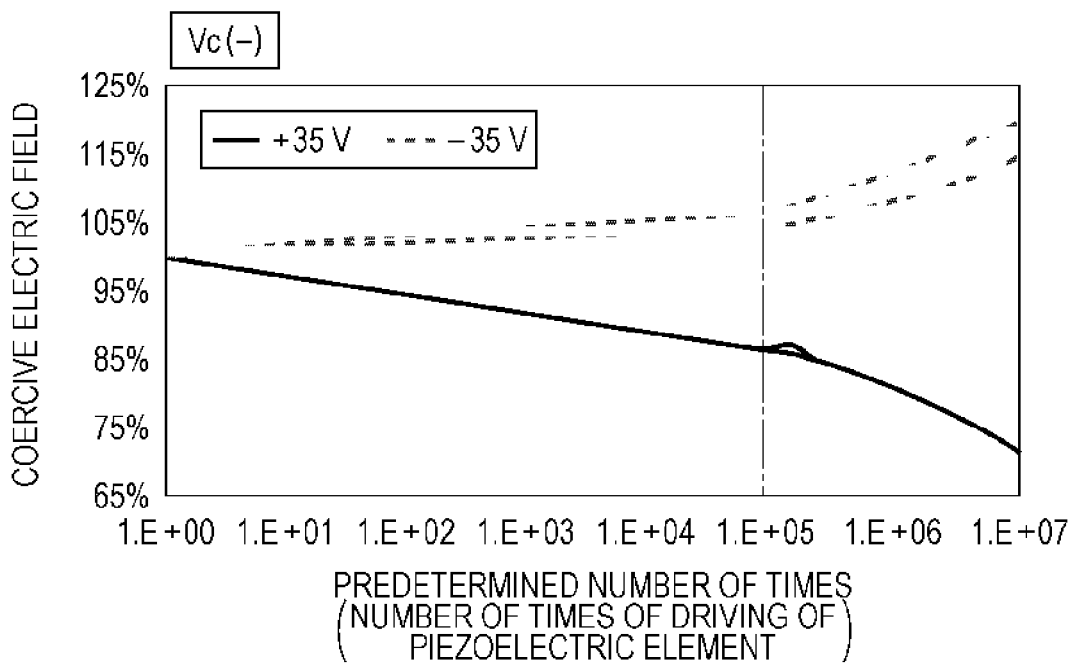

METHOD FOR DRIVING PIEZOELECTRIC ELEMENT, PIEZOELECTRIC ELEMENT, AND PIEZOELECTRIC ELEMENT APPLIED DEVICE

BACKGROUND

1. Technical Field

The present invention relates to a method for driving a piezoelectric element, a piezoelectric element, and a piezoelectric element applied device.

2. Related Art

In general, the piezoelectric element has a piezoelectric layer having an electromechanical conversion characteristic and two electrodes holding the piezoelectric layer therebetween. Devices (piezoelectric element applied devices) employing such a piezoelectric element as a driving source have been actively developed in recent years. As one of the piezoelectric element applied devices, a liquid ejection head typified by an ink jet recording head is mentioned.

As materials (piezoelectric materials) of the piezoelectric layer, lead zirconate titanate (PZT; $Pb(Zr, Ti)O_3$) having a high piezoelectric constant is mentioned, for example. On the other hand, with respect to the PZT, it has also been reported that lead (Pb) is likely to volatilize in a baking process of the piezoelectric layer (for example, refer to JP-A-2012-156160, claim 1, Paragraph [0024]). JP-A-2012-156160 indicates that oxygen deficiency occurs with the volatilization and deletion of Pb and that the oxygen deficiency present near an interface with electrodes causes a reduction in the piezoelectric characteristics.

Also when piezoelectric materials other than PZT are used, it has been reported that the oxygen deficiency may occur in the piezoelectric layer (for example, refer to JP-A-2006-86223, Paragraph [0072], FIG. 7). JP-A-2006-86223 indicates that, due to uneven accumulation of the occurring oxygen deficiency on a low-voltage side, the piezoelectric characteristics decrease.

Therefore, according to JP-A-2012-156160, nitrogen atoms are doped at oxygen sites of an $ABO_3$ type perovskite structure of a composite oxide forming the piezoelectric layer. According to JP-A-2006-86223, when it is judged that a piezoelectric element degrades, a voltage of reverse polarity (voltage which has a high frequency and does not cause displacement of the piezoelectric layer) is applied for a certain period of time.

However, JP-A-2012-156160 requires a process of doping nitrogen. In JP-A-2006-86223, the drive of the piezoelectric element is interrupted for a predetermined time while the voltage of reverse polarity is being applied. In JP-A-2006-86223, when the drive interruption time of the piezoelectric element is reduced, the application time of the voltage of reverse polarity becomes short. In this case, the uneven accumulation of oxygen deficiency (accumulation of oxygen deficiency on low voltage side of the piezoelectric layer) cannot be suppressed, so that the life of the piezoelectric element decreases.

Thus, when the process of doping nitrogen is removed, it becomes difficult to suitably drive the piezoelectric element over a long period of time only with the former techniques. Such a problem is not limited to the case where PZT is used for the piezoelectric material and similarly arises also in the case of using materials other than PZT for the piezoelectric material. Moreover, such a problem is not limited to the piezoelectric element for use in a liquid ejection head and similarly arises also in a piezoelectric element for use in other piezoelectric element applied devices.

SUMMARY

An advantage of some aspects of the invention is to provide a method for driving a piezoelectric element, a piezoelectric element, and a piezoelectric element applied device which can suppress degradation of a piezoelectric element caused by uneven accumulation of oxygen deficiency of a piezoelectric layer and can suitably drive a piezoelectric element over a long period of time.

A first aspect of the invention which solves the above-described problems is a method for driving a piezoelectric element including a first electrode, a piezoelectric layer formed on the first electrode and containing a composite oxide of an $ABO_3$ type perovskite structure, and a second electrode formed on the piezoelectric layer, and the method includes driving the piezoelectric element by applying a signal having a predetermined driving waveform by a predetermined number of times, and driving the piezoelectric element by applying a signal having the predetermined driving waveform in reverse polarity.

According to such an aspect, since the polarity of the driving waveform is reversed every predetermined number of times of driving, the high-voltage side and the low-voltage side can be changed every predetermined number of times of driving between the first electrode and the second electrode. More specifically, even when oxygen deficiency which may occur in the piezoelectric layer (i.e., plus charges) is attracted to the low-voltage side, the other electrode can be changed to the low-voltage side before the oxygen deficiency builds up on the low electrode side of the piezoelectric layer. Therefore, the oxygen deficiency of the piezoelectric layer can be prevented from unevenly building up on one electrode side. Therefore, degradation of the piezoelectric element can be suppressed, so that the life of the piezoelectric element can be prolonged.

Moreover, according to this aspect, since a series of driving waveforms are formed by a driving waveform of forward polarity and a driving waveform of reverse polarity, the drive of the piezoelectric element is not interrupted with the polarity reversal of the driving waveforms. Therefore, the piezoelectric element can be suitably driven.

As described above, according to this aspect, the degradation of the piezoelectric element caused by the uneven accumulation of oxygen deficiency of the piezoelectric layer can be suppressed, so that the piezoelectric element can be suitably driven over a long period of time.

It is preferable that the predetermined number of times be 1,000 times or more and 100,000 times or less. When the predetermined number of times is excessively small, the reversal of an electric dipole is excessively repeated in the piezoelectric layer, so that the polarization axis is easily fixed. As a result, fatigue deterioration may occur in the piezoelectric layer. On the other hand, when the predetermined number of times is excessively large, an internal coercive electric field may occur. As a result, the coercive electric field is shifted, which makes it difficult to accurately drive the piezoelectric element. Therefore, when the fixed number of times of driving is within the range, the piezoelectric element can be more suitably driven over a long period of time.

It is preferable that the piezoelectric element be driven by applying a signal having a driving waveform in forward polarity in which the upper limit value (Vmax1) is larger than 30.0 V and the lower limit value (Vmin1) is smaller than the coercive electric field (Vc1) on the positive side and a signal having a driving waveform in reverse polarity in which the upper limit value (Vmax2) is larger than the coercive electric field (Vc2) on the negative side and the lower limit value (Vmin2) is smaller than −30.0 V. According to this aspect, a series of driving waveforms can be suitably formed by the driving waveform of forward polarity and the driving waveform of reverse polarity. Therefore, the piezoelectric element can be more suitably driven over a long period of time.

It is preferable that the driving waveform in forward polarity and the driving waveform in reverse polarity be symmetric with respect to a lateral axis. According to this aspect, the drive characteristic of the piezoelectric element by the driving waveform of forward polarity and the drive characteristic of the piezoelectric element by the driving waveform of reverse polarity can be brought close to each other. Therefore, a variation of the drive characteristic of the piezoelectric element due to the polarity reversal of the driving waveform can be suppressed. Accordingly, the piezoelectric element can be more suitably driven over a long period of time.

A second aspect of the invention which solves the above-described problems is a piezoelectric element for use in a piezoelectric element applied device having a control unit driving a piezoelectric element by the driving method according to any one of the aspects described above, and the piezoelectric element has a first electrode formed on a substrate, a piezoelectric layer formed on the first electrode and containing a composite oxide of an $ABO_3$ type perovskite structure, and a second electrode formed on the piezoelectric layer, in which the constituent materials of the first electrode and the second electrode are the same.

According to such an aspect, a piezoelectric element which can be driven by the method described above is provided. In the piezoelectric element, the constituent materials of the first electrode and the second electrode are the same, and therefore a variation of the drive characteristic of the piezoelectric element due to the polarity reversal of the driving waveform can be suppressed. Therefore, the piezoelectric element can be suitably driven over a long period of time.

It is preferable that the piezoelectric layer contain at least one of lead (Pb), bismuth (Bi), sodium (Na), and potassium (K) atoms at A sites. Pb, Bi, Na, K, and the like are likely to volatilize in a baking process of the piezoelectric layer. Therefore, when the piezoelectric materials containing these elements are used, oxygen deficiency is likely to occur in the piezoelectric layer due to the volatilization and deletion of Pb, Bi, Na, K, and the like. On the other hand, according to this aspect, uneven accumulation of the oxygen deficiency on one electrode side can be suppressed. Therefore, even when the piezoelectric layer is configured using the piezoelectric materials containing Pb, Bi, Na, K, and the like, the degradation of the piezoelectric element caused by the uneven accumulation of the oxygen deficiency of the piezoelectric layer can be suppressed. Therefore, the piezoelectric element can be suitably driven over a long period of time.

A third aspect of the invention which solves the above-described problems is a piezoelectric element applied device having a piezoelectric element including a first electrode formed on a substrate, a piezoelectric layer formed on the first electrode and containing a composite oxide of an $ABO_3$ type perovskite structure, and a second electrode formed on the piezoelectric layer, and a control unit driving the piezoelectric element by the driving method according to any one of the aspects described above.

According to this aspect, the piezoelectric element applied device capable of realizing the driving method is provided.

It is preferable that the constituent materials of the first electrode and the second electrode be the same. According to this aspect, a variation of the drive characteristic of the piezoelectric element caused due to the fact that the materials of the first electrode and the second electrode are different from each other can be suppressed. Therefore, the piezoelectric element can be suitably driven over a long period of time.

It is preferable that the piezoelectric layer contain at least one of lead (Pb), bismuth (Bi), sodium (Na), and potassium (K) atoms at the A sites. Even when the piezoelectric layer is configured using the piezoelectric material containing Pb, Bi, Na, K, and the like, the piezoelectric element applied device which can be suitably driven over a long period of time is obtained.

BRIEF DESCRIPTION OF THE DRAWINGS

The invention will be described with reference to the accompanying drawings, wherein like numbers reference like elements.

FIG. 7 is a timing chart illustrating a method for driving a piezoelectric element.

FIGS. 9A and 9B are graphs illustrating a variation of a coercive electric field by repeating voltage application.

DESCRIPTION OF EXEMPLARY EMBODIMENTS

Figure 1:
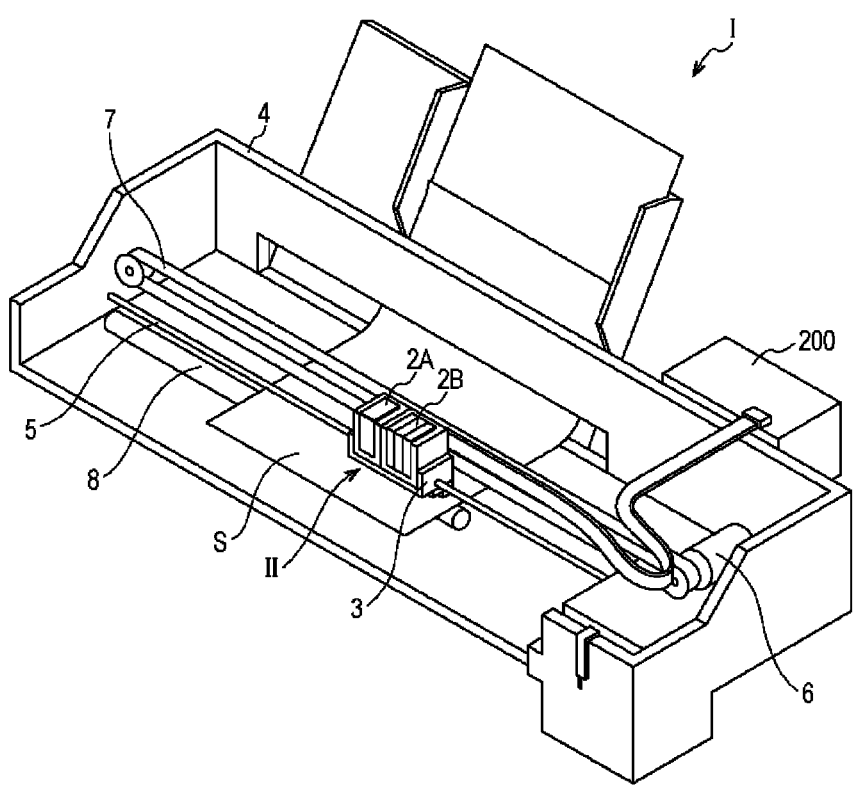
FIG. 1 is a view illustrating the schematic configuration of a recording device.

Hereinafter, an embodiment of the invention is described with reference to the attracted drawings. The following description describes one aspect of the invention and the aspect can be arbitrarily altered within the scope of the invention. Those designated by the same reference numerals indicate the same members, and a description is omitted as appropriate.

FIG. 1 illustrates the schematic configuration of an ink jet recording device (recording device) according to the embodiment of the invention.

In an ink jet recording device I, an ink jet recording head unit (head unit II) is detachably provided in cartridges 2A and 2B. The cartridges 2A and 2B constitute an ink supply unit. The head unit II has a plurality of ink jet recording heads (recording heads) and is placed on a carriage 3. The carriage 3 is provided on a carriage shaft 5 attached to a device body 4 in such a manner as to be movable in the axial direction. The head unit II and the carriage 3 are configured in such a manner as to discharge a black ink composition and a color ink composition, respectively, for example.

The driving force of a driving motor 6 is transmitted to the carriage 3 through a plurality of gears which are not illustrated and a timing belt 7. Thus, the carriage 3 is moved along the carriage shaft 5. The device body 4 is provided with a conveyance roller 8 as a conveyance unit. With the conveyance roller 8, a recording sheet S which is a recording medium, such as paper, is conveyed. The conveyance unit is not limited to the conveyance roller and may be a belt, a drum, or the like.

For the ink jet recording head described above, the piezoelectric element according to this embodiment is used as an actuator. Therefore, the ink jet recording device I can be suitably driven over a long period of time as described in detail below.

Figure 2:
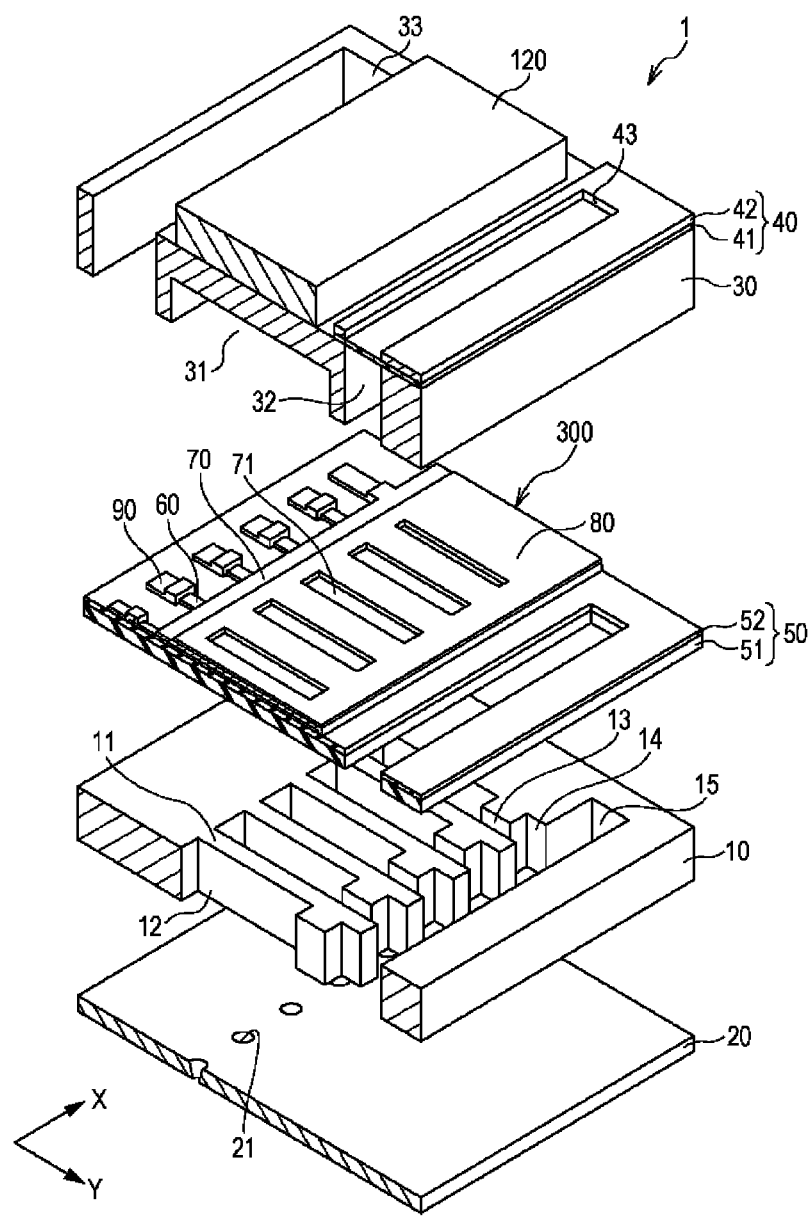
FIG. 2 is an exploded perspective view illustrating the schematic configuration of a recording head.
Figure 3A:
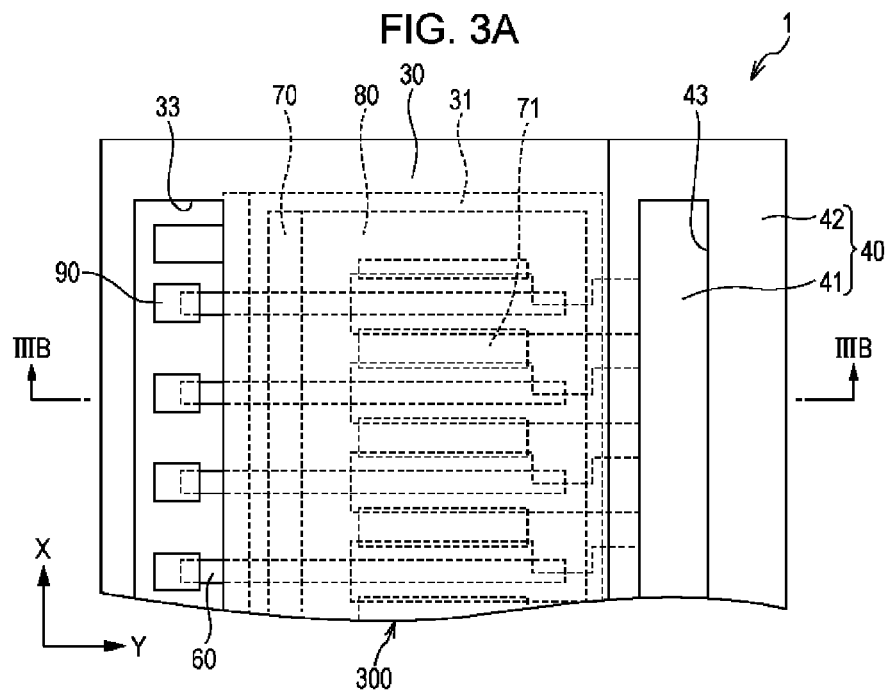
FIG. 3A is a plan view of the schematic configuration of the recording head.
Figure 3B:
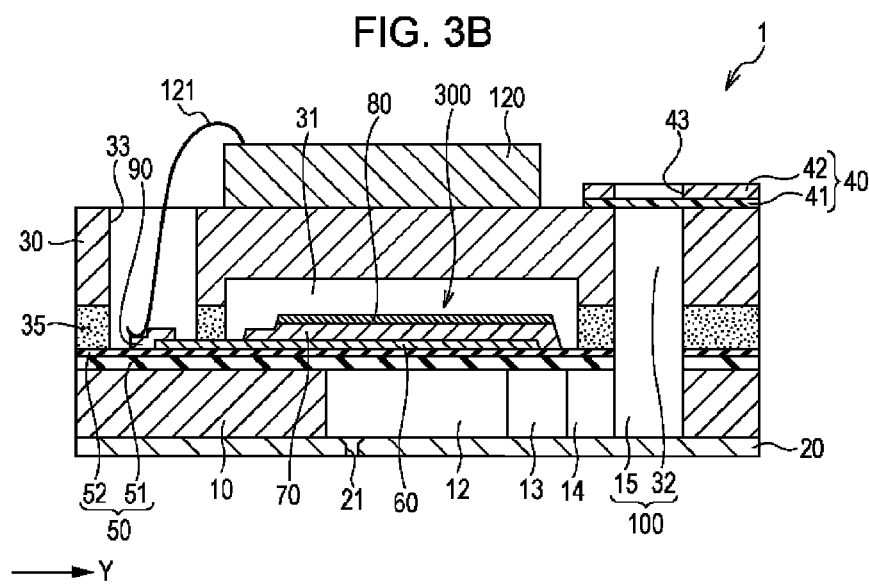
FIG. 3B is a cross sectional view of the schematic configuration of the recording head.

FIG. 2 is an exploded perspective view illustrating the schematic configuration of the ink jet recording head. FIG. 3A is a plan view (plan view in which a flow passage formation substrate is viewed from the piezoelectric element side) illustrating the schematic configuration of the ink jet recording head according to this embodiment. FIG. 3B is a cross sectional view along the IIIB-IIIB line of FIG. 3A.

A plurality of partitions 11 are formed in a flow passage formation substrate 10. A plurality of pressure generating chambers 12 are divided by the partitions 11. More specifically, in the flow passage formation substrate 10, the pressure generating chambers 12 are disposed side by side along a predetermined direction (direction in which nozzle openings 21 discharging the same color ink are disposed side by side). Hereinafter, the predetermined direction is referred to as a "direction in which the pressure generating chambers 12 are disposed side by side" or a "first direction X" and a direction orthogonal to the first direction X is referred to as a "second direction Y". The "first direction X" and the "second direction Y" are also orthogonal to the thickness direction of the piezoelectric element. As such a flow passage formation substrate 10, a silicon single crystal substrate can be used, for example.

On one end portion side in the second direction Y of the pressure generating chamber 12 of the flow passage formation substrate 10, an ink supply path 13 and a communication path 14 are formed. The ink supply path 13 is configured so that the opening area is small by narrowing one side of the pressure generating chamber 12 from the first direction X. The communication path 14 has approximately the same width as the width of the pressure generating chambers 12 in the first direction X. On the outside (opposite to the pressure generating chamber 12 in the second direction Y) of the communication path 14, a communication portion 15 is formed. The communication portion 15 forms a part of a manifold 100. The manifold 100 serves as a common ink chamber of each pressure generating chamber 12. Thus, a liquid flow passage including the pressure generating chamber 12, the ink supply path 13, the communication path 14, and the communication portion 15 is formed in the flow passage formation substrate 10.

To the other surface of the flow passage formation substrate 10, a nozzle plate 20 formed of SUS, for example, is joined. In the nozzle plate 20, the nozzle openings 21 are formed side by side along the first direction X. The nozzle openings 21 each communicate with each pressure generating chamber 12. The nozzle plate 20 can be joined to the flow passage formation substrate 10 with an adhesive, a thermal fusion bonding film, or the like.

On the other surface (surface facing the one surface described above) of the flow passage formation substrate 10, a diaphragm 50 is formed. The diaphragm 50 is configured from an elastic film 51 formed on the flow passage formation substrate 10 and an insulator film 52 formed on the elastic film 51, for example. The elastic film 51 contains silicon dioxide ($SiO_2$), for example. The insulator film 52 contains zirconium dioxide ($ZrO_2$), for example. The elastic film 51, however, may not be a separated member from the flow passage formation substrate 10. A part of the flow passage formation substrate 10 may be thinly processed to be used as the elastic film.

Figure 11A:
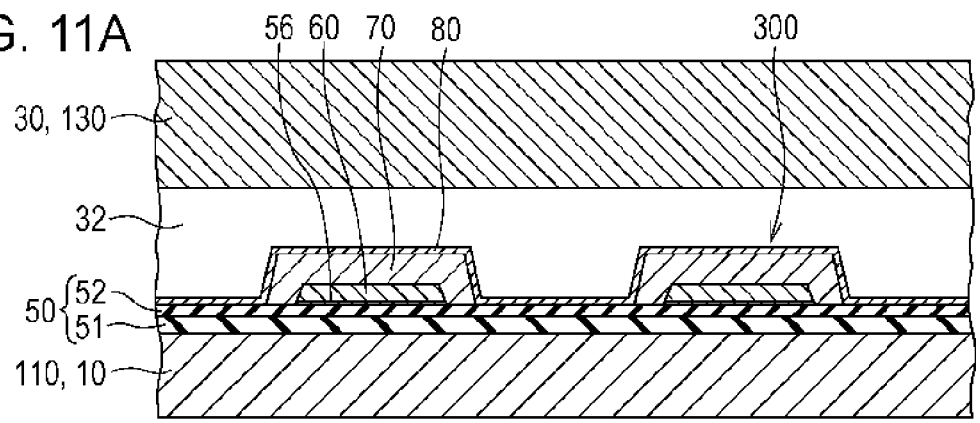
FIGS. 11A to 11C are views illustrating the example of manufacturing a recording head.
Figure 11B:
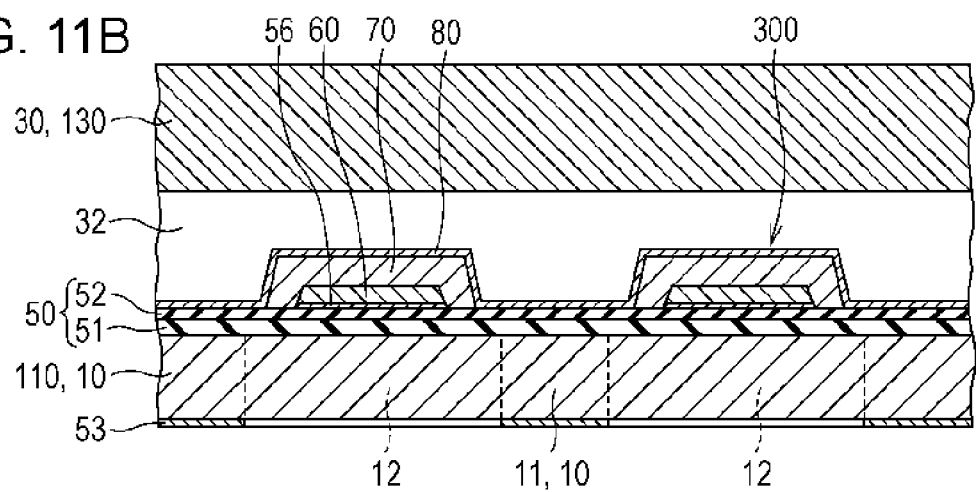
Figure 11C:
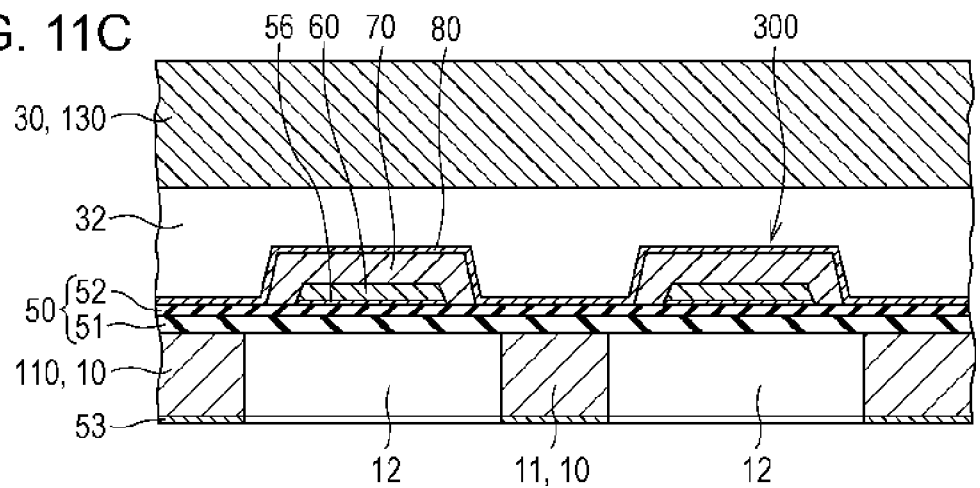

On the insulator film 52, a piezoelectric element 300 including first electrodes 60 having a thickness of about 0.2 µm, piezoelectric layers 70 having a thickness of about 3.0 µm or less and preferably about 0.5 to 1.5 µm, and a second electrode 80 having a thickness of about 0.05 µm is formed through an adhesion layer 56 (not illustrated in FIGS. 3A and 3B, refer to FIGS. 11A to 11C, for example). The adhesion layer contains titanium (Ti), for example, and has a function of increasing the adhesiveness between the piezoelectric layers 70 and the diaphragm 50. The adhesion layer 56, however, can be omitted.

In this embodiment, the diaphragm 50 and the first electrode 60 are displaced by displacement of the piezoelectric layers 70 having an electromechanical conversion characteristic. More specifically, in this embodiment, the diaphragm 50 and the first electrodes 60 substantially have a function as a diaphragm. However, it may be configured so that either or both of the elastic film 51 and the insulator film 52 is/are not provided and only the first electrodes 60 function as a diaphragm. When directly providing the first electrodes 60 on the flow passage formation substrate 10, it is preferable to protect the first electrodes 60 with an insulating protective film or the like in such a manner that the first electrodes 60 and ink are not brought into conduction.

The first electrodes 60 are divided for each pressure generating chamber 12. More specifically, the first electrode 60 is configured as an individual electrode which is independent in each pressure generating chamber 12. The first electrode 60 is formed with a width smaller than the width of the pressure generating chamber 12 in the first direction X. The first electrode 60 is formed with a width larger than the width of the pressure generating chamber 12 in the second direction Y. More specifically, both end portions of the first electrode 60 are provided on the outer side in the second direction Y relative to a region facing the pressure generating chamber 12. To one end portion side (opposite to the communication path 14) of the first electrode 60 in the second direction Y, a lead electrode 90 is connected.

The piezoelectric layer 70 is provided on the plurality of individual electrodes (first electrodes 60) in the first direction X. The piezoelectric layer 70 is formed with a width larger in the second direction Y than the length in the second direction Y of the pressure generating chamber 12. An end portion (right end portion of FIG. 3B) on the side of the ink supply path 13 of the piezoelectric layer 70 is provided on the outer side in the second direction Y relative to an end portion of the first electrode 60. More specifically, one end portion side of the first electrode 60 is covered with the piezoelectric layer 70 in the second direction Y. On the other hand, the other end portion (left end portion of FIG. 3B) of the piezoelectric layer 70 is located on an inner side relative to an end portion of the first electrode 60 in the second direction Y. More specifically, the other end portion side of the first electrode 60 is not covered with the piezoelectric layer 70 in the second direction Y.

The second electrode 80 is continuously provided on the piezoelectric layers 70, the first electrodes 60, and the diaphragm 50 in the first direction X. More specifically, the second electrode 80 is configured as a common electrode common to the plurality of piezoelectric layers 70. Concave portions 71 are formed with the piezoelectric layers 70 and the second electrode 80. The concave portion 71 is present between the first electrodes 60, i.e., a region facing the partition 11. In the first direction X, the width of the concave portion 71 is approximately the same or larger than the width of the partition 11. Thus, the rigidity of a portion (a so-called arm portion of the diaphragm 50) facing an end portion in the second direction Y of the pressure generating chamber 12 of the diaphragm 50 is suppressed, and therefore the piezoelectric element 300 can be favorably displaced. These aspects are merely examples and the invention is not limited to these aspects.

Materials of the first electrode 60 and the second electrode 80 are preferably noble metals, such as platinum (Pt) and iridium (Ir). The material of the first electrode 60 and the material of the second electrode 80 are preferably the same. Also in this embodiment, the first electrode 60 and the second electrode 80 are formed of the same material. However, the material of the first electrode 60 and the material of the second electrode 80 may be materials having conductivity. The material of the first electrode 60 and the material of the second electrode 80 may be differentiated from each other.

In general, in such a piezoelectric element 300, one of the electrodes is configured as a common electrode and the other electrode is configured as an individual electrode. As described above, in this embodiment, the first electrode 60 is configured as an individual electrode and the second electrode 80 is configured as a common electrode. However, no problems arise even when it is configured so that the first electrode is configured as a common electrode and the second electrode is configured as an individual electrode because of a drive circuit or wiring.

The piezoelectric layer 70 is configured using a piezoelectric material containing a composite oxide of a perovskite structure represented by General Formula $ABO_3$. In this embodiment, lead zirconate titanate (PZT; Pb (Zr, Ti)$O_3$) is used as the piezoelectric material. By the use of PZT for the piezoelectric material, the piezoelectric layer 70 having a relatively large piezoelectric constant is obtained.

In the composite oxide of the perovskite structure represented by General Formula $ABO_3$, 12 oxygen atoms are coordinated at the A sites and 6 oxygen atoms are coordinated at the B sites to form an octahedron. In this embodiment, lead (Pb) atoms are located at the A sites and zirconium (Zr) atoms and titanium (Ti) atoms are located at the B sites.

The piezoelectric material is not limited to the PZT described above. Other elements may be contained at the A sites and the B sites. For example, the piezoelectric materials may be perovskite materials, such as barium zirconate titanate (Ba(Zr, Ti)$O_3$), lead lanthanum zirconate titanate (Pb, La) (Zr, Ti)$O_3$), lead magnesium niobate zirconium titanate (Pb(Zr, Ti) (Mg, Nb)$O_3$), or lead niobate zirconate titanate (Pb(Zr, Ti, Nb)$O_3$) containing silicon.

In addition thereto, the piezoelectric materials may be materials in which the content of Pb is small (so-called low-lead materials) or materials not containing Pb (so-called lead-free materials). When the low-lead material is used for the piezoelectric material, the use amount of Pb can be reduced. Moreover, when the lead-free material is used, it is not necessary to use Pb. Therefore, an environmental load can be reduced by the use of the low-lead materials or the lead-free materials.

As the lead-free piezoelectric materials, BFO materials containing bismuth ferrite (BFO; BiFeO$_3$) are mentioned, for example. In BFO, Bi atoms are located at the A sites and iron (Fe) atoms are located at the B sites. Other elements may be added to BFO. For example, to BFO, at least one kind of element selected from manganese ferrite (Mn), aluminum (Al), lantern (La), barium (Ba), titanium (Ti), cobalt (Co), cerium (Ce), samarium (Sm), chromium (Cr), potassium (K), lithium (Li), calcium (Ca), strontium (Sr), vanadium (V), niobium (Nb), tantalum (Ta), molybdenum (Mo), tungsten (W), nickel (Ni), zinc (Zn), praseodymium (Pr), neodymium (Nd), and europium (Eu) may be added.

As other examples of the lead-free piezoelectric materials, KNN materials containing sodium potassium niobate (KNN; KNaNbO$_3$) are mentioned. Other elements may be added to KNN. For example, to KNN, at least one kind of element selected from manganese (Mn), lithium (Li), barium (Ba), calcium (Ca), strontium (Sr), zirconium (Zr), titanium (Ti), bismuth (Bi), tantalum (Ta), antimony (Sb), iron (Fe), cobalt (Co), silver (Ag), magnesium (Mg), zinc (Zn), copper (Cu), vanadium (V), chromium (Cr), molybdenum (Mo), tungsten (W), nickel (Ni), aluminum (Al), silicon (Si), lantern (La), cerium (Ce), praseodymium (Pr), neodymium (Nd), promethium (Pm), samarium (Sm), and europium (Eu) may be added.

The piezoelectric materials include materials having a composition in which the elements are partially deleted, materials having a composition in which some of the elements are excessively contained, and materials having a composition in which the elements are partially replaced by other elements. Materials whose composition deviates from a stoichiometric composition due to the fact that the elements are partially deleted or excessively contained and materials in which the elements are partially replaced by other elements are also included in the piezoelectric materials according to this embodiment insofar as the basic characteristics of the piezoelectric layer 70 are not altered.

Herein, when elements which are likely to volatilize, such as Pb, Bi, Na, and K, are contained in the piezoelectric material, these elements are likely to volatilize in a process of forming the piezoelectric layer 70 (for example, baking process). When the element volatilizes, in order to maintain the balance of charges, oxygen deficiency (i.e., plus charges) occurs in the piezoelectric layer 70. On the other hand, there is a possibility that, when such oxygen deficiency is attracted to the low-voltage side of the piezoelectric layer 70, so that the oxygen deficiency unevenly builds up (builds up on the low-voltage side of the piezoelectric layer 70), the piezoelectric characteristics decreases. To address the problem, in this embodiment, even in the case where the piezoelectric layer 70 is configured using the piezoelectric material containing the element which is likely to volatilize, since the piezoelectric element is driven by a method described in detail below, a degradation of the piezoelectric element caused by the uneven accumulation of the oxygen deficiency of the piezoelectric layer 70 can be suppressed. It is a matter of course that the piezoelectric materials usable in this embodiment are not limited to the materials containing Pb, Bi, Na, K, and the like mentioned above.

On the flow passage formation substrate 10 on which the piezoelectric element 300 is formed, a protective substrate 30 is joined with an adhesive 35. The protective substrate 30 has a manifold portion 32. At least one part of the manifold 100 is configured by the manifold portion 32. The manifold portion 32 according to this embodiment penetrates the protective substrate 30 in the thickness direction and also is formed in the width direction of the pressure generating chamber 12. The manifold portion 32 communicates with the communication portion 15 of the flow passage formation substrate 10 as described above. By these configurations, the manifold 100 serving as a common ink chamber of each pressure generating chamber 12 is configured.

In the protective substrate 30, a piezoelectric element holding portion 31 is formed in a region including the piezoelectric element 300. The piezoelectric element holding portion 31 has space in such a manner as not to block the movement of the piezoelectric element 300. This space may be sealed or not may be sealed. In the protective substrate 30, a through-hole 33 which penetrates the protective substrate 30 in the thickness direction is formed. Into the through-hole 33, an end portion of the lead electrode 90 is exposed.

Onto the protective substrate 30, a drive circuit 120 which functions as a signal processing unit is fixed. For the drive circuit 120, a circuit substrate and a semiconductor integrated circuit (IC) can be used, for example. The drive circuit 120 and the lead electrode 90 are electrically connected to each other through connection wiring 121. The drive circuit 120 can be electrically connected to a printer controller 200. Such a drive circuit 120 functions as the control unit according to this embodiment.

Onto the protective substrate 30, a compliance substrate 40 including a sealing film 41 and a fixed substrate 42 is joined. A region facing the manifold 100 of the fixed substrate 42 forms an opening portion 43 completely removed in the thickness direction. Therefore, one surface of the manifold 100 is sealed only with the sealing film 41 having flexibility.

Figure 4:
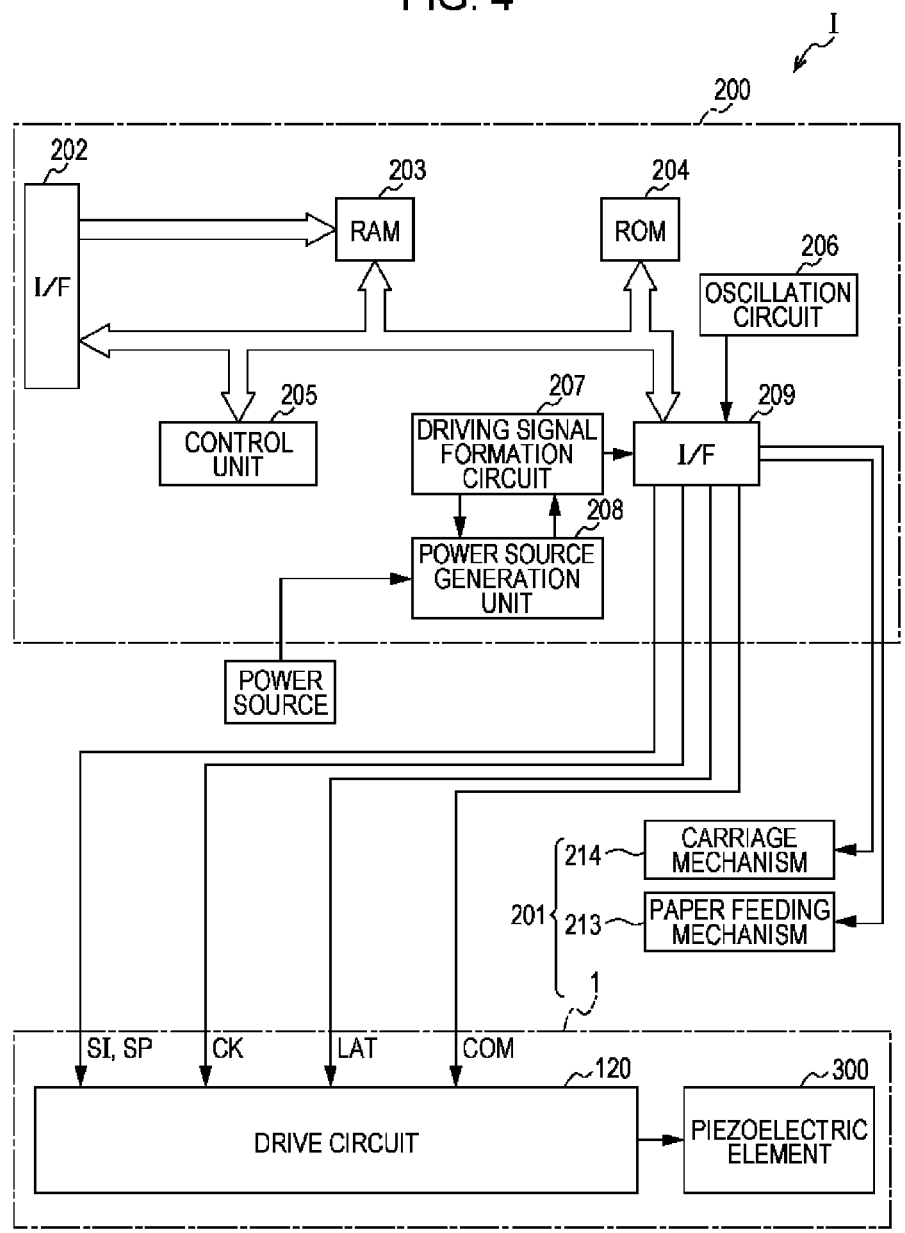
FIG. 4 is a block diagram illustrating the outline of the control configuration of the recording device.

Next, the control systems of the ink jet recording device I are described. FIG. 4 is a block diagram illustrating the outline of the control configuration of the ink jet recording device.

As illustrated in FIG. 4, the ink jet recording device I is configured from the printer controller 200 and a print engine 201. The printer controller 200 is configured from an external interface 202, a RAM 203 temporarily storing various data, a ROM 204 storing a control program and the like, a control unit 205 including a CPU and the like, an oscillation circuit 206 generating a clock signal, a driving signal formation circuit 207 generating a driving signal to be supplied to the ink jet recording head 1, a power source generation unit 208 generating a power supply for use in the driving signal formation circuit 207, and an internal interface 209 transmitting dot pattern data and the like developed based on the driving signal or print data to the print engine 201.

Among the above, the power source generation unit 208 supplies a driving power supply to the driving signal formation circuit 207. The driving signal formation circuit 207 generates a driving signal based on the driving power supply generated by the power source generation unit 208.

The print engine 201 is configured from the ink jet recording head 1, a paper feeding mechanism 213, and a carriage mechanism 214. Among the above, into the drive circuit 120 of the ink jet recording head 1, a driving signal (COM) is input from the driving signal formation circuit 207 of the printer controller 200 through the connection wiring 121. Into the drive circuit 120, predetermined head control signals (a clock signal CLK, a latch signal LAT, a change signal CH, pixel data SI, setting data SP, and the like) are input from the printer controller 200.

The control systems are mainly configured from a microcomputer having a known configuration. Specifically, an operation of each unit of the control systems is realized by execution of programs by the microcomputer. By providing the control systems, a piezoelectric element applied device capable of realizing a method for driving the piezoelectric element according to this embodiment is provided.

Next, the method for driving a piezoelectric element is described. This driving method is a method for driving the piezoelectric element by driving the piezoelectricity element by a predetermined driving waveform by a predetermined number of times, and then reversing the polarity of the driving waveform. Specifically, the driving method according to this embodiment is a method including driving the piezoelectricity element by a driving waveform of forward polarity by a predetermined number of times, changing the driving waveform to a driving waveform of reverse polarity, and then driving the piezoelectric element. The driving method according to this embodiment is also a method including driving the piezoelectricity element by a predetermined number of times by a driving waveform of reverse polarity, changing the driving waveform to a driving waveform of forward polarity, and then driving the piezoelectric element.

The predetermined driving waveform is a waveform unit showing changes in a series of driving voltages to be given to the piezoelectric element until the piezoelectric element 300 is returned to the original state again after displaced (deformed) from the original state. The drive for returning the piezoelectric element 300 to the original state again after displaced (deformed) from the original state is carried out by a series of processes of changing voltages (i.e., voltages to be applied to the piezoelectric layer 70) to be applied between the first electrode 60 and the second electrode 80. Such a driving waveform has a first type and a second type. The first type at least includes a process of increasing a voltage to be applied between the first electrode 60 and the second electrode 80 from the intermediate potential to the maximum potential, a process of reducing the potential to the minimum potential after reaching the maximum potential, and a process of finally returning the potential to the intermediate potential. The second type at least includes a process of reducing a voltage to be applied between the first electrode 60 and the second electrode 80 from the intermediate potential to the minimum potential, a process of increasing the potential to the maximum potential after reaching the minimum potential, and a process of finally returning the potential to the intermediate potential. When the driving waveform of forward polarity is the first type driving waveform, the driving waveform of reverse polarity is the second type driving waveform. When the driving waveform of forward polarity is the second type driving waveform, the driving waveform of reverse polarity is the first type driving waveform. Hereinafter, a more detailed description is given.

Figure 5A:
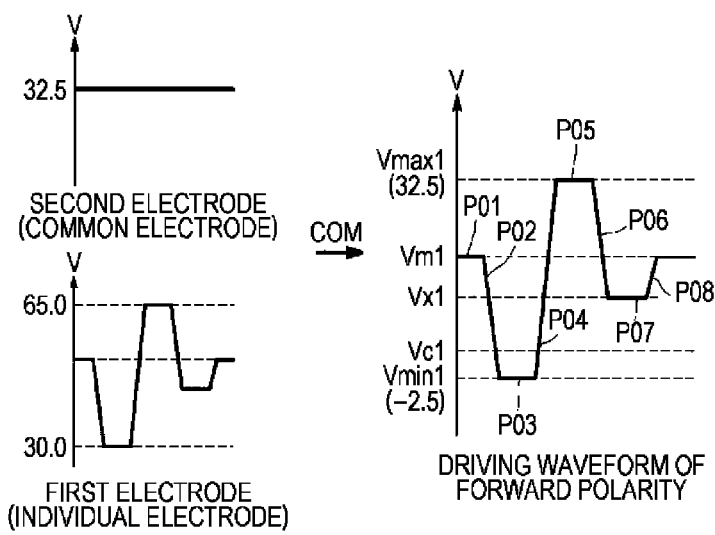
FIGS. 5A to 5C are graphs illustrating a driving waveform of forward polarity.
Figure 5B:
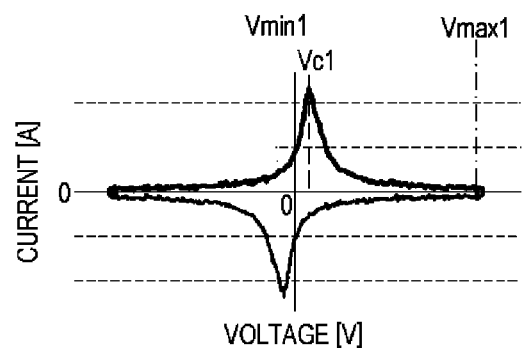
Figure 5C:
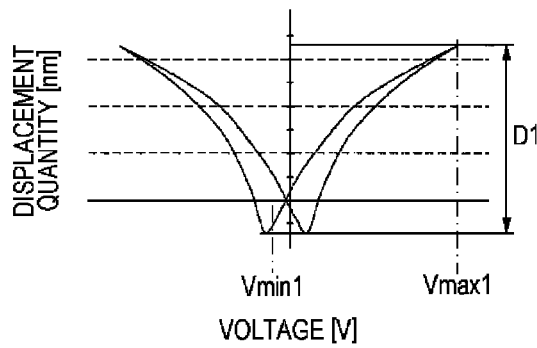

FIGS. 5A to 5C are graphs illustrating the driving waveform of forward polarity according to this embodiment. FIG. 5A illustrates an example of the driving waveform of forward polarity. FIG. 5B shows the relationship between a voltage and a current when the driving waveform of FIG. 5A is input. FIG. 5C shows displacement obtained when the driving waveform of FIG. 5A is input.

In the example of FIG. 5A, the second electrode 80 is maintained at a potential of 32.5 V. Then, a potential having a predetermined intermediate potential, the minimum potential of about 30.0 V, and the maximum potential of about 65.0 V is given to the first electrode 60. These potentials are given based on the driving signal (COM) of the control systems shown in FIG. 4.

Then, a potential difference (Potential of the first electrode 60–Potential of the second electrode 80) of the first electrodes 60 based on the potential of the second electrode 80 is the driving voltage V of the piezoelectric layer 70. The profile showing the transition with time of such a driving voltage V is the driving waveform of the piezoelectric element 300. In the driving waveform of forward polarity shown in FIG. 5A, the upper limit value Vmax1 (herein 32.5 V) of the driving voltage V is larger than 30.0 V and the lower limit value Vmin1 (herein −2.5 V) is smaller than the coercive electric field Vc1 on the positive side.

More specifically, the driving waveform of forward polarity shown in FIG. 5A has a relationship of Lower limit value Vmin1<Coercive electric field Vc1 on the positive side<Intermediate potential Vm1<30.0 V<Upper limit value Vmax1 as shown in FIG. 5B. The polarization of the piezoelectric layer 70 is reversed from the cathode to the anode or from the anode to the cathode with the coercive electric field as the border.

By such a driving waveform of forward polarity, a process P01 of maintaining the intermediate potential Vm1, a process P02 of reducing the voltage V from the state to the lower limit value Vmin1, a process P03 of maintaining the lower limit value Vmin1 for a certain period of time, a process P04 of increasing the voltage V from the lower limit value Vmin1 to the upper limit value Vmax1, a process P05 of maintaining the upper limit value Vmax1 for a certain period of time, a process P06 of reducing the voltage V from the upper limit value Vmax1 to a predetermined potential Vx1 which is smaller than the intermediate potential Vm1 and larger than the coercive electric field Vc1, a process P07 of maintaining the predetermined potential Vx1 for a certain period of time, and a process P08 of increasing the voltage V from the predetermined potential Vx1 to the intermediate potential Vm1 are carried out.

In the process P02, the piezoelectric element 300 is displaced in a direction where the capacity of the pressure generating chambers 12 is expanded. Thus, the meniscus in the nozzle openings 21 is attracted to the side of the pressure generating chambers 12. In the subsequent process P04, the piezoelectric element 300 is displaced in a direction where the capacity of the pressure generating chambers 12 is reduced. Thus, the meniscus in the nozzle openings 21 is greatly pushed out from the pressure generating chambers 12, so that ink is ejected from the nozzle openings 21.

By such a driving waveform of forward polarity, displacement D1 shown in the butterfly curve of FIG. 5C is obtained. More specifically, the piezoelectric element 300 is driven by the driving waveform of forward polarity, so that the displacement D1 is obtained.

Figure 6A:
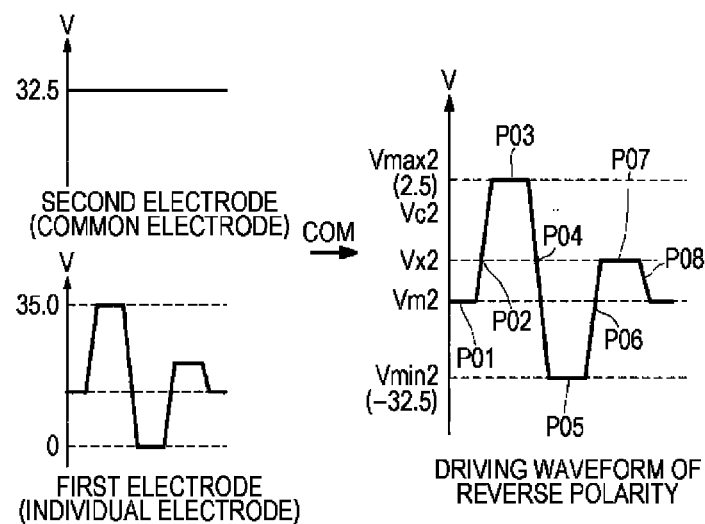
FIGS. 6A to 6C are graphs illustrating a driving waveform of reverse polarity.
Figure 6B:
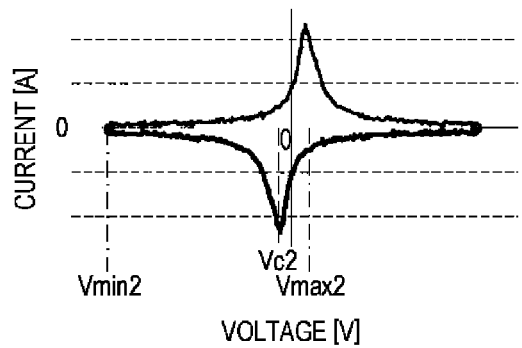
Figure 6C:
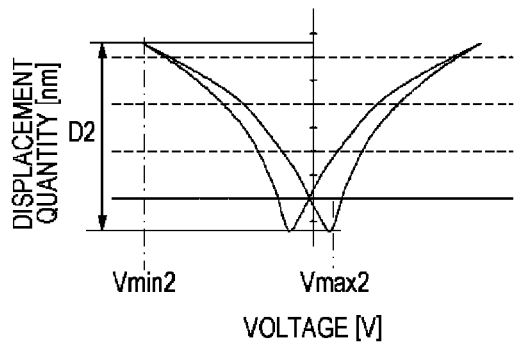

FIGS. 6A to 6C are graphs illustrating a driving waveform of reverse polarity according to this embodiment. FIG. 6A shows an example of the driving waveform of reverse polarity. FIG. 6B shows the relationship of a voltage and a current when the driving waveform of FIG. 6A is input. FIG. 6C shows displacement obtained when the driving waveform of FIG. 6A is input.

In the example of FIG. 6A, the second electrode 80 is maintained at a potential of 32.5 V. A potential having a predetermined intermediate potential, a minimum potential of about 0 V, and a maximum potential of about 35.0 V is given to the first electrode 60. The potentials are given based on the driving signal (COM) of the control systems shown in FIG. 4.

In the driving waveform of reverse polarity shown in FIGS. 6A to 6C, the upper limit value Vmax2 (herein 2.5 V) of the driving voltage V is larger than the coercive electric field Vc2 on the negative side and the lower limit value Vmin2 (herein −32.5 V) is smaller than −30.0 V. More specifically, the driving waveform of reverse polarity shown in FIGS. 6A to 6C has a relationship of Lower limit value Vmin2<−30.0 V<Intermediate potential Vm2<Coercive electric field Vc2 on the negative side<Upper limit value Vmax2 as shown in FIG. 6B.

By such a driving waveform of reverse polarity, a process p01 of maintaining the intermediate potential Vm2, a process p02 of increasing the voltage V from the state to the upper limit value Vmax2, a process p03 of maintaining the upper limit value Vmax2 for a certain period of time, a process p04 of reducing the voltage V from the upper limit value Vmax2 to the lower limit value Vmin2, a process p05 of maintaining the lower limit value Vmin2 for a certain period of time, a process p06 of increasing the voltage V from the lower limit value Vmin2 to a predetermined potential Vx2 which is larger than the intermediate potential Vm2 and smaller than the coercive electric field Vc2, a process p07 of maintaining the predetermined potential Vx2 for a certain period of time, and a process p08 of reducing the voltage V from the predetermined potential Vx2 to the intermediate potential Vm2 are carried out.

In the process p02, the piezoelectric element 300 is displaced in a direction where the capacity of the pressure generating chambers 12 is expanded and the piezoelectric element 300 is displaced in the process p04 in a direction where the capacity of the pressure generating chambers 12 is reduced.

By such a driving waveform of forward polarity, displacement D2 shown in the butterfly curve of FIG. 5C is obtained. More specifically, the piezoelectric element 300 is driven by the driving waveform of forward polarity, so that the displacement D2 is obtained.

The driving waveform of forward polarity and the driving waveform of reverse polarity according to this embodiment are described above. On the other hand, the driving waveforms shown in FIG. 5A and FIG. 6A each are a part of the entire driving waveform (driving waveform of 1 time). The driving waveform of forward polarity shown in FIG. 5A is the first type waveform. The driving waveform of the reverse polarity shown in FIG. 6A is the second type waveform.

FIG. 7 is a timing chart illustrating the method for driving a piezoelectric element according to this embodiment. FIG. 7 also schematically shows the movement of oxygen deficiency when the oxygen deficiency (i.e., plus charges) of the piezoelectric layer 70 occurs.

The method for driving a piezoelectric element according to this embodiment includes carrying out a process of driving the piezoelectric element 300 by the driving waveform of forward polarity (at t01 to at t11). When the oxygen deficiency occurs in the piezoelectric layer 70, the oxygen deficiency is attracted to the low-voltage side (herein the second electrode 80 side).

At t11 when driven by the driving waveform of forward polarity by a predetermined number of times (Ta=n times), the polarity of the driving waveform is reversed. Even when the oxygen deficiency of the piezoelectric layer 70 is attracted to the second electrode 80 side, the other electrode (herein the first electrode 60) can be changed to the low-voltage side before the oxygen deficiency builds up on the low electrode side of the piezoelectric layer 70. Hereinafter, the piezoelectric element is driven by the driving waveform of reverse polarity (at t11 to at t21). Thus, the oxygen deficiency is attracted to the low-voltage side (herein the first electrode 60 side).

At t21 when driven by the driving waveform of reverse polarity by the predetermined number of times (Tb=m times), the polarity of the driving waveform is reversed. The other electrode (herein the second electrode 80) can be changed to the low-voltage side before the oxygen deficiency builds up on the low electrode side of the piezoelectric layer 70. Hereinafter, the piezoelectric element is driven by the driving waveform of forward polarity (on and after t21). Thereafter, the process of driving the piezoelectric element by a predetermined driving waveform by a predetermined number of times, reversing the polarity of the driving waveform, and then driving the piezoelectric element is repeated.

According to such a driving method, uneven accumulation of the oxygen deficiency of the piezoelectric layer 70 on one electrode side can be suppressed. Therefore, degradation of the piezoelectric element 300 can be suppressed and the life of the piezoelectric element 300 can be prolonged. Moreover, since a series of driving waveforms are formed by the driving waveform of forward polarity and the driving waveform of reverse polarity, the drive of the piezoelectric element is not interrupted due to the polarity reversal of the driving waveform. As described above, according to this aspect, the degradation of the piezoelectric element 300 caused by the uneven accumulation of the oxygen deficiency of the piezoelectric layer 70 can be suppressed, so that the piezoelectric element 300 can be suitably driven over a long period of time.

The example of driving a piezoelectric element using the driving waveform of forward polarity is described first but either the driving waveform of forward polarity or the driving waveform of reverse polarity may be applied first. The polarity of the driving waveform is preferably reversed when the driving voltage V is at the intermediate potential Vm1 or Vm2. Thus, when the piezoelectric element 300 is in a drive standby state, a high-voltage side and a low-voltage side can be changed between the first electrode and the second electrode. Therefore, bad influence on the drive of the piezoelectric element 300 due to the polarity reversal of the driving waveform can be suppressed.

Figure 8:
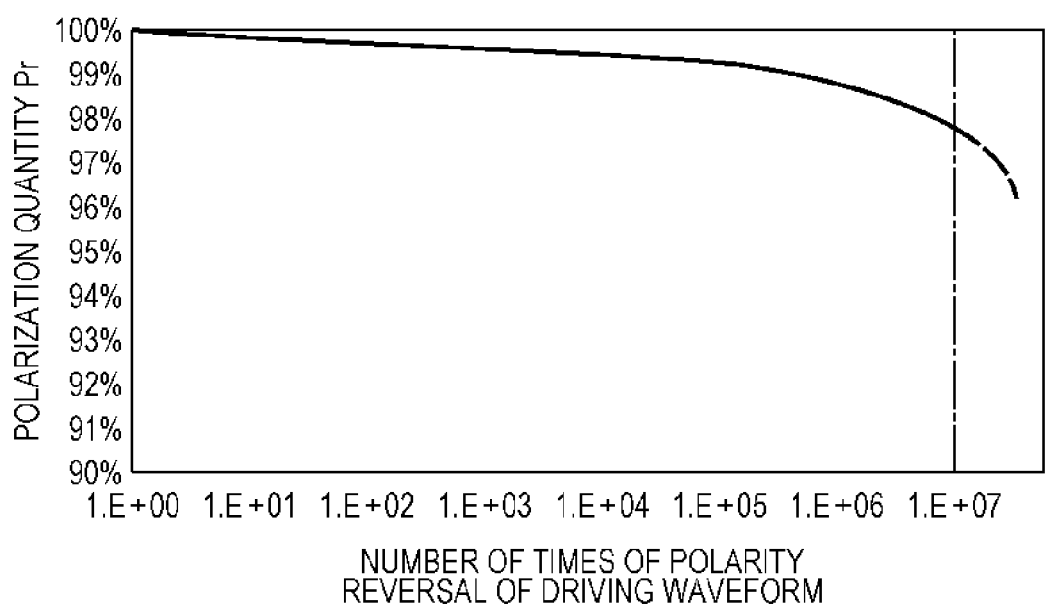
FIG. 8 is a graph illustrating a reduction in polarization quantity by repeating voltage application.

The number of times of the polarity reversal of the driving wave is preferably 10,000,000 times ($10^7$ times) or less. When the number of times of the polarity reversal of the driving waveform is excessively large, the reversal of an electric dipole is excessively repeated in the piezoelectric layer, so that the polarization axis is likely to be fixed. This is considered to be because electrons are trapped in structural defects, such as oxygen deficiency, so that a fixed electric field is formed, which blocks the polarization reversal. In the crystal lattice in which the polarization axis is fixed, a reduction in the polarization quantity (i.e., a reduction in displacement quantity) is caused (Fatigue degradation). FIG. 8 also shows that, when the number of times of the polarity reversal of the driving waveform is in the range of 100,000 times or less, a reduction in polarization quantity Pr is relatively small.

The number of times when the operation of the piezoelectric element 300 is secured also needs to be take into consideration. The number of times when the operation of the piezoelectric element 300 is secured is 10 billion times, 15 billion times, 20 billion times, 25 billion times, or 30 billion times, for example. Therefore, the predetermined number of times n or m is preferably 1,000 times or more, 1,500 times or more, 2,000 times or more, 2,500 times or more, or 3,000 times or more, for example. These values are derived from "Number of times when the operation of the piezoelectric element 300 is secured/Number of times of polarity reversal of driving waveform". When the predetermined number of times n or m is excessively small, the number of times of the polarity reversal of the driving waveform excessively increase, so that there arises a possibility that the Fatigue degradation occurs.

On the other hand, the predetermined number of times n or m is preferably 100,000 times ($10^5$ times) or less. The fact that the predetermined number of times n or m is excessively large is a cause of space charge polarization. Then, by an electric field formed by the polarization, depolarization due to a lattice defect occurs in the piezoelectric layer 70, so that a so-called bias potential is applied. As a result, the coercive electric field is shifted. In this case, it becomes difficult to accurately drive the piezoelectric element 300. FIGS. 9A and 9B also show that, when the predetermined number of times is in the range of 100,000 times or less, the fluctuation of the coercive electric field is relatively small.

The driving waveform is preferably vertically symmetric before and after the polarity reversal. Also in this embodiment, the driving waveform of forward polarity and the driving waveform of reverse polarity are vertically symmetric with 0 V (GRAND) as the border. Thus, the drive characteristic of the piezoelectric element by the driving waveform of forward polarity and the drive characteristic of the piezoelectric element by the driving waveform of reverse polarity can be brought close to each other. Therefore, a variation of the drive characteristic of the piezoelectric element due to the polarity reversal of the driving waveform can be suppressed.

Particularly in this embodiment, since the constituent materials of the first electrode and the second electrode are the same, a variation of the drive characteristic of the piezoelectric element due to the polarity reversal of the driving waveform can be further suppressed as compared with the case where the constituent materials are differ from each other.

Next, an example of a method for manufacturing a piezoelectric element is described together with a method for manufacturing the ink jet recording head 1.

Figure 10A:
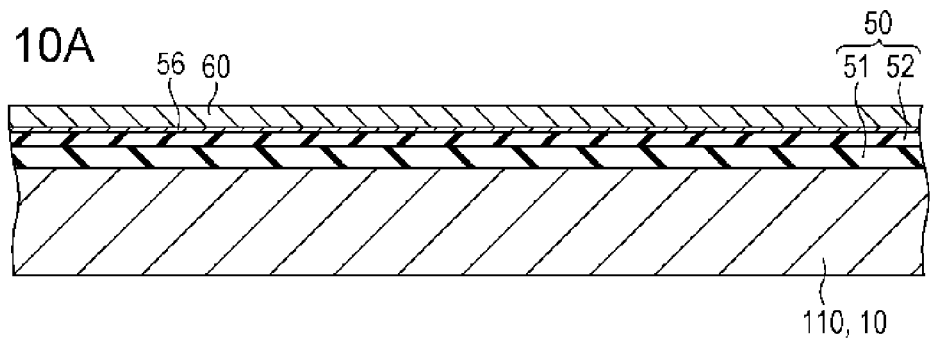
FIGS. 10A to 10D are views illustrating an example of manufacturing a recording head.

First, the elastic film 51 containing silicon dioxide and the like is formed on the surface of the wafer for flow passage formation substrate, and then the insulator film 52 containing zirconium dioxides and the like is formed on the elastic film 51. The diaphragm 50 is configured from the elastic film 51 and the insulator film 52. Subsequently, the adhesion layer 56 containing titanium oxide and the like is formed on the insulator film 52 by a sputtering method, thermal oxidation, or the like. Then, as illustrated in FIG. 10A, the first electrode 60 is formed on the adhesion layer 56 by a sputtering method, a vapor-depositing method, or the like.

Figure 10B:
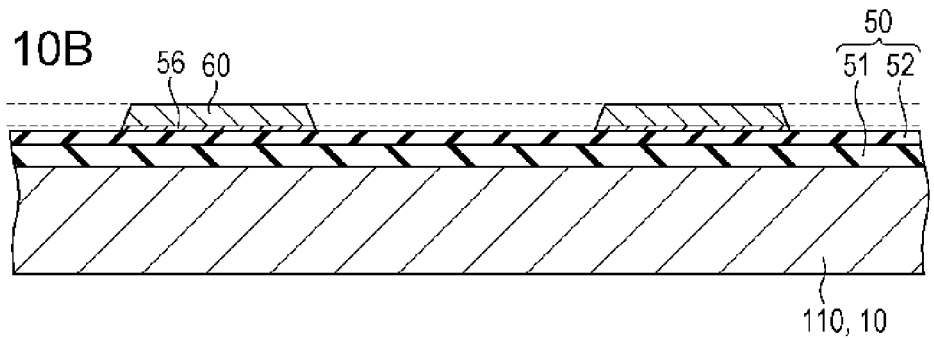
Figure 10C:
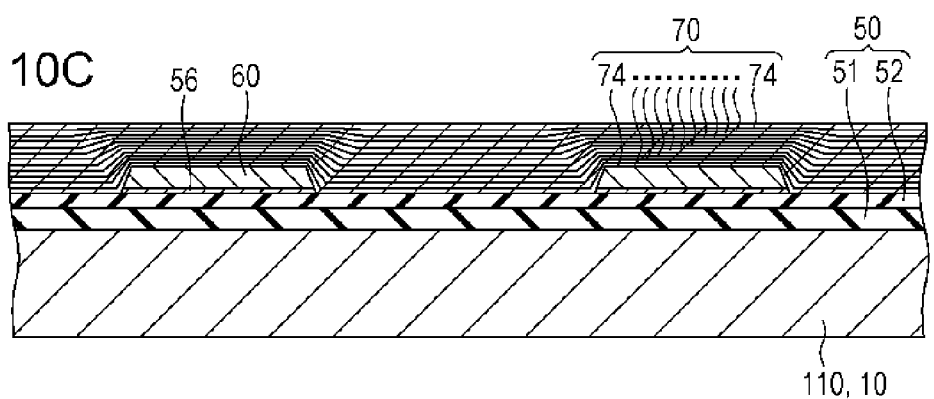

Subsequently, as illustrated in FIG. 10B, the adhesion layer 56 and the first electrode 60 are simultaneously patterned on the first electrode 60 by the use of a resist having a predetermined shape (not illustrated) as a mask. Next, as illustrated in FIG. 10C, a plurality of piezoelectric films 74 are formed in such a manner as to be overlapped with the adhesion layer 56, the first electrode 60, and the diaphragm 50 to form the piezoelectric layer 70. The piezoelectric film 74 can be formed by, for example, a chemical solution method, such as an MOD method or a sol-gel method, including applying and drying a solution containing a metal complex, and then performing degreasing to obtain the piezoelectric film 74. In addition thereto, the piezoelectric film 74 can be formed also by a laser ablation method, a sputtering method, a pulsed•laser•deposition method (a PLD method), a CVD method, an aerosol•deposition method, or the like.

A specific procedure when forming the piezoelectric film 74 by the chemical solution method includes, first, applying a composition for oxide layer formation (precursor solution) containing an MOD solution or a sol containing a metal complex to the adhesion layer 56, the first electrode 60, and the diaphragm 50 to form a piezoelectric precursor film (not illustrated) (application process).

Subsequently, the applied piezoelectric precursor film is heated to a predetermined temperature, e.g., about 130° C. to about 250° C., and then dried for a certain period of time (dry process). Next, the dried piezoelectric precursor film is heated to a predetermined temperature, e.g., 300° C. to 450° C., and then held for a certain period of time for degreasing (degreasing process). Then, the piezoelectric precursor film is heated to a predetermined temperature, e.g., about 650° C. to about 800° C., and then held for a certain period of time for crystallization to form the piezoelectric film 74 (baking process). As a heating device to be used in the drying process, the degreasing process, and the baking process, an RTA (Rapid Thermal Annealing) device and a hot plate which perform heating by irradiation with an infrared lamp and the like are mentioned, for example. The application process, the drying process, and the degreasing process or the application process, the drying process, the degreasing process, and the baking process are repeated two or more times according to a desired film thickness or the like to form the piezoelectric layer 70 including two or more of the piezoelectric films 74.

When the elements which are likely to volatilize are contained in the piezoelectric material, these elements are likely to volatilize in the baking process. When the elements volatilize, oxygen deficiency occurs in the piezoelectric layer 70 in order to maintain the balance of charges. The piezoelectric element is driven by the method as described above in this embodiment. Therefore, even when the piezoelectric layer 70 is formed using the piezoelectric material containing the elements which are likely to volatilize, the degradation of the piezoelectric element 300 caused by the uneven accumulation of the oxygen deficiency of the piezoelectric layer 70 can be suppressed.

Figure 10D:
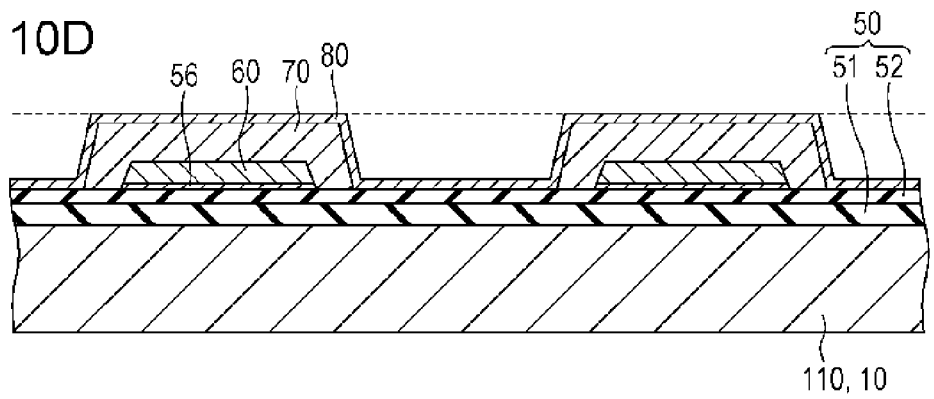

Thereafter, the piezoelectric layer 70 is patterned corresponding to each pressure generating chamber 12. Then, as illustrated in FIG. 10D, the second electrode 80 is formed over the entire surface of one surface (surface on which the piezoelectric layers 70 are formed) of a wafer 110 for flow passage formation substrate, i.e., in such a manner as to be overlapped with the piezoelectric layers 70, the first electrodes 60, and the diaphragm 50. For the patterning, a so-called photolithographic method can be used. The patterning, however, can also be performed by dry etching, such as reactive ion etching and ion milling, wet etching, or the like.

Then, the lead electrode 90 (refer to FIG. 2, for example) is formed and also patterned into a predetermined shape. Then, as illustrated in FIG. 11A, a wafer 130 for protective substrate is joined to the piezoelectric element 300 side of the wafer 110 for flow passage formation substrate through an adhesive, and then the thickness of the wafer 110 for flow passage formation substrate is reduced to a predetermined thickness. Subsequently, as illustrated in FIG. 11B, a mask film 53 is newly formed on the wafer 110 for flow passage formation substrate, and then the wafer 110 for flow passage formation substrate is patterned into a predetermined shape. Then, as illustrated in FIG. 11C, the wafer 110 for flow passage formation substrate is subjected to anisotropic etching (wet etching) using an alkaline solution, such as KOH, through the mask film 53.

Thereafter, the pressure generating chambers 12 corresponding to the piezoelectric elements 300 and the ink supply path 13, the communication path 14, the communication portion 15, and the like illustrated in FIG. 2 are formed according to a usual method. Then, unnecessary portions of the outer peripheral edge portion of the wafer 110 for flow passage formation substrate and the wafer 130 for protective substrate are cut and removed by dicing or the like. Furthermore, the nozzle plate 20 provided with the nozzle openings 21 is joined to a surface opposite to the wafer 130 for protective substrate of the wafer 110 for flow passage formation substrate. The compliance substrate 40 is joined to the wafer 130 for protective substrate. Then the wafer 110 for flow passage formation substrate and the like are divided into the flow passage formation substrate 10 and the like of one chip size, whereby the ink jet recording head 1 according to this embodiment is obtained.

As described above, one embodiment of the invention is described. However, the basic configuration of the invention is not limited to the aspects described above.

Figure 12A:
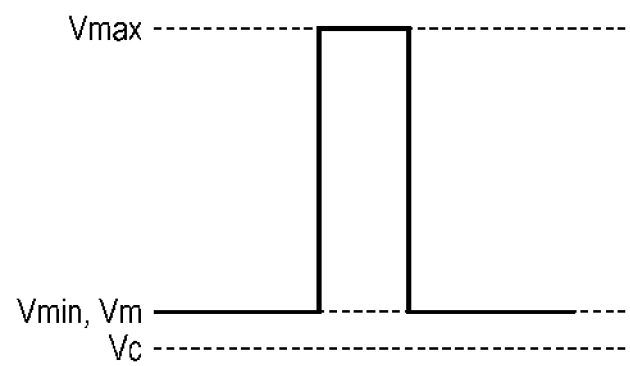
FIGS. 12A and 12B are graphs illustrating a modification of driving waveforms.
Figure 12B:
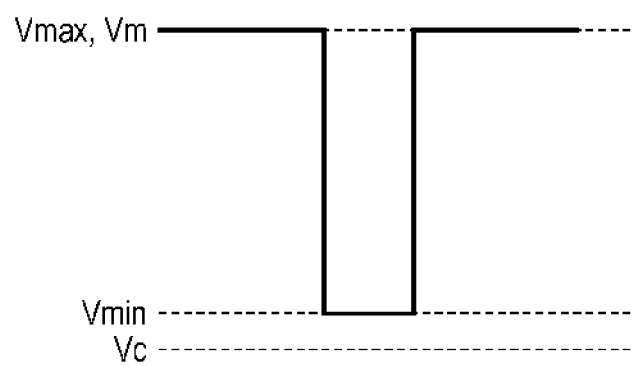

For example, the driving waveform of forward polarity and the driving waveform of reverse polarity are not limited to the examples described above. The driving waveform of forward polarity and the driving waveform of reverse polarity may be obtained based on the driving waveform (FIG. 12A) realizing a so-called push ejection mode to form a series of driving waveforms. Moreover, the driving waveform of forward polarity and the driving waveform of reverse polarity may be obtained based on the driving waveform (FIG. 12B) realizing a so-called pull ejection mode to form a series of driving waveforms.

The predetermined number of times n of driving the piezoelectric element 300 by the driving waveform of forward polarity and the predetermined number of times m of driving the piezoelectric element 300 by the driving waveform of reverse polarity may not be the same number of times. Considering an electrical load or a control characteristic, any one of the relationships of n<m, n=m, and n>m can be selected as appropriate. The predetermined number of times n or m is not limited to a fixed number of times and may vary according to an operation environment and conditions.

In the embodiment described above, the silicon single crystal substrate is mentioned as an example of the flow passage formation substrate 10. However, the flow passage formation substrate 10 is not limited to the example mentioned above and may be materials, such as an SOI substrate and glass, for example.

In the embodiment described above, a description is given taking the ink jet recording head as an example of the piezoelectric element applied device. However, it is a matter of course that the invention can also be applied to liquid ejection heads ejecting liquid other than ink. Examples of the other liquid ejection heads include, for example, various kinds of recording heads for use in image recording devices, such as a printer, coloring material ejection heads for use in manufacturing of color filters of liquid crystal displays, electrode material ejection heads for use in electrode formation of an organic electroluminescence display, an FED (field emission display), and the like, bio-organic material ejection heads for use in manufacturing of bio-chips, and the like.

Moreover, the invention is not limited to the piezoelectric element to be placed on a liquid ejection head and can also be applied to a piezoelectric element to be placed on other piezoelectric element applied devices. As one example of the piezoelectric element applied devices, an ultrasonic device, a motor, a pressure sensor, a pyroelectric element, a ferroelectric element, and the like are mentioned. Moreover, completed bodies utilizing these piezoelectric devices, e.g., liquid ejection devices utilizing the liquid ejection head described above, an ultrasonic sensor utilizing the ultrasonic device described above, a robot utilizing the motor described above as a driving source, an IR sensor utilizing the pyroelectric element, a ferroelectric memory utilizing a ferroelectric element, and the like are also included in the piezoelectric element applied devices.

The constituent components illustrated in the drawings, i.e., the thickness, the width, the relative positional relationship, and the like of the layers and the like, are sometimes exaggeratingly illustrated for describing the invention. The term on in this specification does not limit the positional relationship of the constituent component to "immediately above". For example, the expressions "a first electrode on a substrate" and "a piezoelectric layer on a first electrode" do not exclude configurations in which other constituent components are present between the substrate and the first electrode and between the first electrode and the piezoelectric layer.

According to the invention, the degradation of the piezoelectric element caused by uneven accumulation of oxygen deficiency of the piezoelectric layer can be suppressed, so that the piezoelectric element can be suitably driven over a long period of time. The piezoelectric element can be suitably driven not only during the use of a product but in a test of a DC application test (load durability test).

The present application claims priority to Japanese Patent Application No. 2015-017778 filed on Jan. 30, 2015, which is hereby incorporated by reference in its entirety.

What is claimed is:

1. A method for driving a piezoelectric element including a first electrode, a piezoelectric layer formed on the first electrode and containing a composite oxide of an $ABO_3$ type perovskite structure, and a second electrode formed on the piezoelectric layer, the method comprising:
    driving the piezoelectric element by applying a signal having a predetermined driving waveform by a predetermined number of times; and
    driving the piezoelectric element by applying a signal having the predetermined driving waveform in reverse polarity,
    wherein the predetermined driving waveform includes at least a first process of increasing a voltage applied between the first electrode and the second electrode from a first intermediate potential to a first potential, a second process of reducing the voltage applied from the first potential to a second potential, and a third process of returning the voltage applied to the first intermediate potential, and
    wherein the predetermined driving waveform in reverse polarity includes at least a first process of decreasing the voltage applied from a second intermediate potential to a third potential, a second process of increasing the voltage applied from the third potential to a fourth potential, and a third process of returning the voltage applied to the second intermediate potential.

2. The method for driving a piezoelectric element according to claim 1, wherein the predetermined number of times is 1,000 times or more and 100,000 times or less.

3. The method for driving a piezoelectric element according to claim 1, wherein the piezoelectric element is driven by applying a signal having a driving waveform in forward polarity in which an upper limit value (Vmax1) is larger than 30.0 V and a lower limit value (Vmin1) is smaller than a coercive electric field (Vc1) on a positive side and a signal having a driving waveform in reverse polarity in which an upper limit value (Vmax2) is larger than a coercive electric field (Vc2) on a negative side and a lower limit value (Vmin2) is smaller than −30.0 V.

4. The method for driving a piezoelectric element according to claim 1, wherein the driving waveform in forward polarity and the driving waveform in reverse polarity are symmetric with respect to a lateral axis.

5. A piezoelectric element for use in a piezoelectric element applied device having a control unit driving the piezoelectric element by the driving method according to claim 1, the piezoelectric element comprising:
    a first electrode formed on a substrate;
    a piezoelectric layer formed on the first electrode and containing a composite oxide of an $ABO_3$ type perovskite structure; and
    a second electrode formed on the piezoelectric layer, wherein constituent materials of the first electrode and the second electrode are the same.

6. The piezoelectric element according to claim 5, wherein the piezoelectric layer contains at least one of lead (Pb), bismuth (Bi), sodium (Na), and potassium (K) atoms at A sites.

7. A piezoelectric element applied device, comprising:
    a piezoelectric element including a first electrode formed on a substrate, a piezoelectric layer formed on the first electrode and containing a composite oxide of an $ABO_3$ type perovskite structure, and a second electrode formed on the piezoelectric layer; and
    a control unit driving the piezoelectric element by the driving method according to claim 1.

8. The piezoelectric element applied device according to claim 7, wherein constituent materials of the first electrode and the second electrode are the same.

9. The piezoelectric element applied device according to claim 7, wherein the piezoelectric layer contains at least one of lead (Pb), bismuth (Bi), sodium (Na), and potassium (K) atoms at A sites.

* * * * *